United States Patent
Rodenbeck et al.

(10) Patent No.: US 10,026,701 B1
(45) Date of Patent: Jul. 17, 2018

(54) ELECTROMAGNETIC ISOLATION STRUCTURE

(71) Applicant: Sandia Corporation, Albuquerque, NM (US)

(72) Inventors: Christopher T. Rodenbeck, Albuquerque, NM (US); Kenneth A. Peterson, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 5 days.

(21) Appl. No.: 14/444,867

(22) Filed: Jul. 28, 2014

(51) Int. Cl.
 *H01L 23/66* (2006.01)
 *H01L 21/56* (2006.01)
 *H01L 23/552* (2006.01)

(52) U.S. Cl.
 CPC ............ *H01L 23/66* (2013.01); *H01L 21/563* (2013.01); *H01L 23/552* (2013.01); *H01L 2223/6616* (2013.01)

(58) Field of Classification Search
 CPC ............... H01L 23/29; H01L 23/295; H01L 2924/3025; H01L 23/66; H01L 21/563; H01L 23/552
 See application file for complete search history.

(56) References Cited

U.S. PATENT DOCUMENTS

| | | | | |
|---|---|---|---|---|
| 5,889,232 A * | 3/1999 | Ichikawa | ............. | H01L 21/565 174/524 |
| 7,009,288 B2 * | 3/2006 | Bauer | ................. | H01L 23/295 257/690 |
| 8,497,156 B2 * | 7/2013 | Moriya | ................... | H01L 23/29 257/659 |
| 8,809,694 B2 * | 8/2014 | Yoshida | .............. | H05K 1/0218 174/260 |
| 2002/0039667 A1 * | 4/2002 | Takaya | ................... | H01B 3/004 428/824 |

(Continued)

FOREIGN PATENT DOCUMENTS

JP 02002201358 A * 7/2002 ............ C08L 101/00

OTHER PUBLICATIONS

Rodenbeck, et al., "Electrooptic Inspection of Vector Leakage in Radiofrequency Multichip Modules", IEEE Trans. Electromagnetic Compatibility, 2013, pp. 1-7.

*Primary Examiner* — Thanh T Nguyen
(74) *Attorney, Agent, or Firm* — Medley, Behrens & Lewis, LLC (57) ABSTRACT

The various technologies presented herein relate to isolating an integrated circuit from electromagnetic radiation/interference. The integrated circuit can be encapsulated in a coating (e.g., a conformal coating). A conductive layer can be formed over the coating, where the conductive layer is deposited to connect with an electromagnetic shielding layer included in a substrate upon which the integrated circuit is located thereby forming a Faraday cage around the integrated circuit. Hollow spheres can be included in the coating to improve the dielectric constant of the coating. The conductive layer can be formed from at least one of metallic material or a polymer coating which includes conductive material. The integrated circuit can be utilized in conjunction with a heat sink and further, the integrated circuit can be of a flip chip configuration.

12 Claims, 4 Drawing Sheets

(56) References Cited

U.S. PATENT DOCUMENTS

| | | | |
|---|---|---|---|
| 2007/0132111 A1* | 6/2007 | Lien | H01L 21/56 |
| | | | 257/787 |
| 2009/0236700 A1* | 9/2009 | Moriya | H01L 23/29 |
| | | | 257/659 |
| 2011/0274299 A1* | 11/2011 | Shaw | B81B 7/0064 |
| | | | 381/174 |
| 2012/0193770 A1* | 8/2012 | Yamada | H01L 21/561 |
| | | | 257/659 |

* cited by examiner

ELECTROMAGNETIC ISOLATION STRUCTURE

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

Electromagnetic isolation (EMI) for advanced radio frequency (RF) modules is challenging conventional fabrication techniques for production of integrated circuits (ICs), e.g., RFIC's. An integrated circuit may be composed of a plurality of semiconductor devices, such as transistors or the like, which can be produced according to a variety of techniques. To facilitate increased integration and speed of semiconductor devices, a trend of continuously scaling semiconductors (e.g., reducing the size and features of semiconductor devices) has emerged. Reducing the size of a semiconductor and/or semiconductor feature size provides improved speed, performance, density, cost per unit, etc., of resultant integrated circuits. However, as semiconductor devices and device features have become smaller, conventional fabrication techniques are being challenged in their ability to produce modules comprising a plurality of integrated circuits located with high proximity to each other, for example, a high density multi-chip module (MCM). During operation of such a module one or more effects can be encountered which engender deleterious operation of one or more of the integrated circuits comprising the module. Such unwanted effects can include crosstalk between one or more RFIC's, performance degradation of a RFIC owing to RF interference with a clocking component, jamming of one or more components where the RFICs form part of a multi-radio module, etc. Further, for example, where the RFICs form part of an analog-digital system, or a digital-digital system, the high clocking speeds utilized in such digital systems can result in the harmonics of the clock extending higher than a RF signal produced by the digitally operating system which, in an aspect, can cause interference of the RF signal.

Conventional approaches to mitigating such deleterious effects can include incorporation of via-fence enclosures and metal lids into a module construction, whereby the via-fence enclosures and/or the metal lids can act as a localized Faraday shield. However, the via-fence enclosures and/or the metal lids, along with other approaches such as metal cans, clamshells, and gaskets can be bulky and add no value to the module. Further, these approaches can also have their own associated fabrication issues and complexities such as joining of the lids, etc., to the integrated circuit by techniques such as brazing, soldering, welding, sealing, laser tacking, gasketing, etc.

Further, the aforementioned conventional approaches are failing to satisfy isolation requirements which are being requested as the operating conditions of RFICs are being further extended. For example, microshielding to satisfy an isolation requirement of about 150 dB. Accordingly, a premium is continually being placed on shielding that will permit miniaturization in conjunction with high performance, as radars and other electronic systems move toward MCM structures.

SUMMARY

The following is a brief summary of subject matter that is described in greater detail herein. This summary is not intended to be limiting as to the scope of the claims.

Various exemplary embodiments presented herein relate to isolating an integrated circuit from electromagnetic radiation effects. In an exemplary embodiment an integrated circuit device is presented, wherein the integrated circuit device comprising an integrated circuit located on a substrate, wherein the substrate further comprising an electromagnetic shielding layer, a coating layer deposited on the integrated circuit, a lower surface of the coating layer covering the integrated circuit, and a conductive layer formed on the upper surface of the coating layer, wherein the conductive layer is formed to connect with the electromagnetic shielding layer, to facilitate electromagnetically isolating the integrated circuit.

Another exemplary embodiment comprising a method for forming an integrated circuit device comprising locating an integrated circuit onto a substrate, wherein the substrate further comprising an electromagnetic shielding layer, forming a coating layer over the integrated circuit to facilitate encapsulating the integrated circuit between the coating layer and the substrate, and forming a conductive layer over the coating layer, wherein the conductive layer being formed to connect with the electromagnetic shielding layer to facilitate electromagnetically isolating the integrated circuit.

A further exemplary embodiment comprising an integrated circuit device is presented, wherein the integrated circuit device comprising an integrated circuit located on a substrate, wherein the substrate further comprising an electromagnetic shielding layer, a coating layer deposited on the integrated circuit, a lower surface of the coating layer covering the integrated circuit and the coating layer comprising a conformal coating and at least one hollow sphere, the sphere filled with at least one of an inert gas or air, and a conductive layer formed on the upper surface of the coating layer, wherein the conductive layer is formed to connect with the electromagnetic shielding layer, to facilitate electromagnetically isolating the integrated circuit.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Various technologies pertaining to electromagnetically isolating one or more components are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Further, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

As noted above, exemplary embodiments presented herein relate to EMI of components, such as RFIC's, for example, and other components such as a high speed digital processor. As mentioned, as the size of semiconductor devices and device features have become smaller, conventional fabrication techniques are being challenged in their ability to produce device density modules which remain unaffected by such effects as crosstalk, clocking interference, jamming, etc. For example, owing to the reduction in size of portable electronic devices (e.g., a cellphone) the increasing complexity of onboard components and according increase in features and quality thereof, high density multi-chip modules are common in such devices (as well as devices such as a portable computer, a laptop computer, a global positioning system (GPS), a radar system, a navigation system, a communication system, etc.). Accordingly, owing to the high component density, effects such as crosstalk, etc., are of concern.

Figure 1:
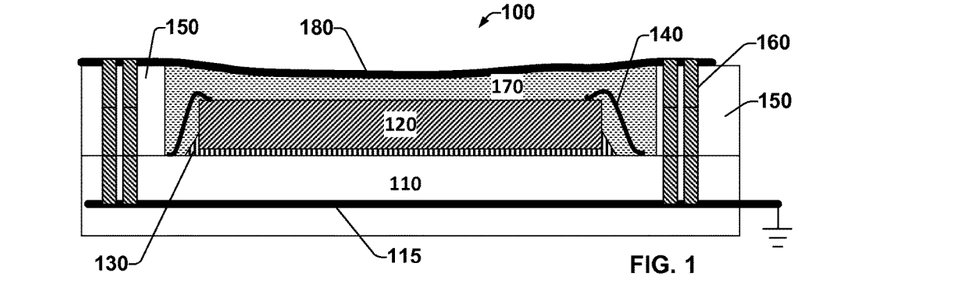
FIG. 1 illustrates a block diagram 100 of a structure for isolating a device from electromagnetic effects, according to an embodiment.

FIG. 1 illustrates system 100 comprising a configuration for isolating an RFIC component, according to an embodiment. System 100 comprises a base substrate layer 110, such as a printed circuit board (PCB), a low-temperature cofired ceramic, etc., which can include a cage layer 115 which can be grounded, where the cage layer 115 can be a film, a mesh, at least one cage layer, a via fence, a metallized layer, etc.

Sidewalls 150 are located on substrate 110 which can act to constrain a coating as further described herein. Further located on substrate 110 is an RFIC 120 (e.g., a Si-based IC, a gallium arsenide (GaAs) IC, etc.), which can be attached by any suitable material such as a low-loss die attach 130, where low-loss die attach 130 can comprise an epoxy resin, solder, etc., which can further have a low dielectric permivitty. Wirebonds 140 can provide interconnection between the RFIC 120 and other components associated therewith, for example another RFIC (not shown) located on the substrate 110. Wirebonds 140 can comprise of any suitable conductor such as aluminum, copper, gold, etc. A coating layer 170 can be formed over the RFIC 120, the die attach 130, and the wirebonds 140, where the volume of coating 170 can be contained by the respective surfaces of RFIC 120, the die attach 130, and the wirebonds 140 and the sidewalls 150. Coating 170 can provide mechanical support and further can exclude contaminants (e.g., fingerprint residues, moisture, etc.) which can disrupt circuit operation of the RFIC 120. Coating 170 can comprise of any suitable material such as a conformal coating, a glob-top, a resin, an epoxy resin (e.g., a difunctional bisphenol A/epichlorohydrin derived liquid epoxy resin), etc., whereby coating 170 can be cured by any suitable operation such as heat cured, chemically cured, cross-linked with a curing agent, etc. Upon curing of coating 170 (and planarization if necessary, e.g., a chemical-mechanical planarization (CMP)), a conductive layer 180 can be formed over the coating 170, where conductive layer 180 can be connected to the cage layer 115 by vias 160 to facilitate electromagnetic isolation of the RFIC 120, e.g., conductive layer 180, cage layer 115, and vias 160 can form a Faraday cage around the RFIC 120. Conductive layer 180 can be formed from any suitable conductive material such as a metal (e.g., as a thin film, as a thick film, etc.), and formed by any suitable technology such as physical vapor deposition (PVD), sputter coating, evaporation, etc., where such technologies can be vacuum based, as necessary. Further, conductive layer 180 can be a conductive ink and can be formed over coating 170 by a silkscreening operation, for example. In another embodiment, conductive layer 180 can be a conductive epoxy formed over coating 170 by any suitable technique. In another embodiment, coating 170 can be a cofired/thick film dielectric coating with the conductive layer 180 formed thereover.

Figure 7:
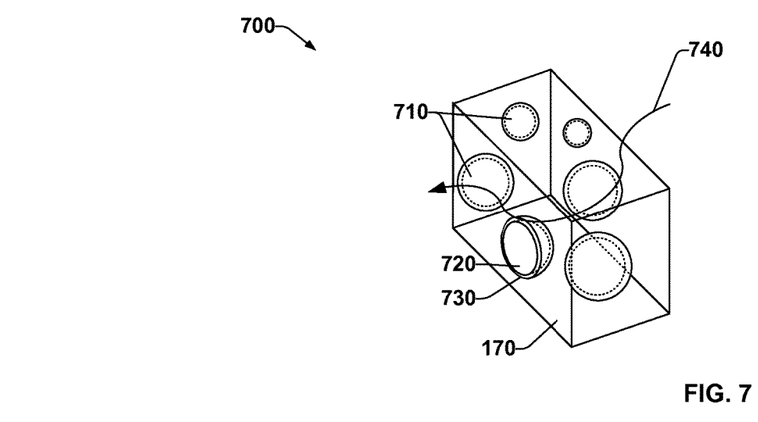
FIG. 7 illustrates a block diagram 100 of a structure for isolating a device from electromagnetic effects, according to an embodiment.

In an embodiment, the dielectric constant, k, of the coating 170 can be reduced by increasing the volume of material having a lower k value than a primary volume of material comprising coating 170. For example, air can be incorporated into the volume of material forming coating 170, where the air can be incorporated in the form of hollow spheres/balloons. In an embodiment, with reference to FIG. 7, the wall material 730 of the spheres 710 can comprise of the same material as the composition of material forming coating 170. In another embodiment, the wall material 730 of the spheres 710 can comprise of disparate material to the composition of material forming coating 170, for example, coating 170 can be a resin while wall material 730 can be a glass or polymer. In an embodiment, the spheres 710 can be filled with any material such as air, an inert gas, a liquid, a solid, etc. Also spheres 710 can be solid throughout, for example, beads of glass or other material. The spheres 710 can be of any size, for example, of a size less than an electromagnetic radiation impinging on system 100 to further facilitate a reduction in the k of coating 170. For example, coating 170 when formed from an epoxy resin can have a k constant of about 3.5, while incorporating the air filled spheres 710 into the resin can reduce the k constant of coating 170 to about 2.0, or better. In another embodiment, coating 170 can be formed from a foam material, which during cure can form an open-cell structure or a closed-cell structure, over which conductive layer 180 can be formed. In such an embodiment, advantage is taken of the trapped pockets of gas, liquid, and/or solid.

Figure 2:
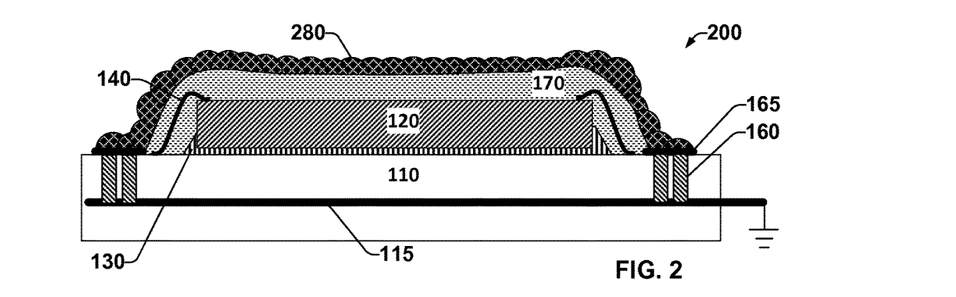
FIG. 2 illustrates a block diagram 200 of a structure for isolating a device from electromagnetic effects, according to an embodiment.

FIG. 2 illustrates system 200 comprising a configuration for isolating an RFIC component, according to an embodiment. System 200 comprises a base substrate layer 110 which includes a cage layer 115, which can be grounded, and one or more vias 160, where vias 160 can be connected to by an interconnect 165. Located on substrate 110 is an RFIC 120, which is located by any suitable die attach material 130. Wirebonds 140 can provide interconnection between the RFIC 120 and other components associated therewith, for example another RFIC located on the substrate 110. A coating layer 170 can be formed over the RFIC 120, the die attach 130, and the wirebonds 140, where the volume of coating 170 is sufficient to coat the required components but can leave the interconnects 165 exposed. Subsequent to curing coating 170, a conductive polymer layer 280 can be formed over the coating 170. The polymer layer 280 being formed to electrically connect to interconnects 165, to facilitate electromagnetic isolation of the RFIC 120, e.g., conductive polymer layer 280, cage layer 115, vias 160, and interconnect 165 can form a Faraday cage around the RFIC 120. Polymer layer 280 can be formed from any suitable organic material having a required conductivity. Further, the conductivity of the organic material of polymer layer 280 can be supplemented by the addition of other conductive material, such as particles of silver.

Figure 3:
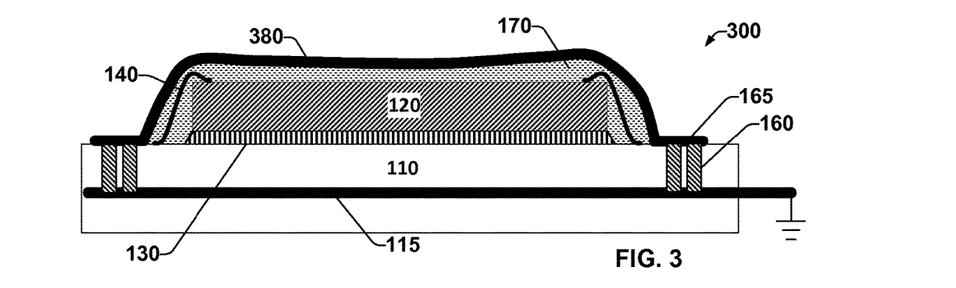
FIG. 3. illustrates a block diagram 300 of a structure for isolating a device from electromagnetic effects, according to an embodiment.

FIG. 3 illustrates system 300 comprising a configuration for isolating an RFIC component, according to an embodiment. System 300 comprises a base substrate layer 110 which includes a cage layer 115, which can be grounded, and one or more vias 160, where vias 160 can be connected to by an interconnect 165. Located on substrate 110 is an RFIC 120, which is located by any suitable die attach material 130. Wirebonds 140 can provide interconnection between the RFIC 120 and other components associated therewith, for example another RFIC located on the substrate 110. A coating layer 170 can be formed over the RFIC 120, the die attach 130, and the wirebonds 140, where the volume of coating 170 is sufficient to coat the required components but can leave the interconnects 165 exposed. Subsequent to curing coating 170, a conductive layer 380 can be formed over the coating 170. The conductive layer 380 being formed to electrically connect to interconnects 165, to facilitate electromagnetic isolation of the RFIC 120, e.g., conductive layer 380, cage layer 115, vias 160, and interconnect 165 can form a Faraday cage around the RFIC 120. Conductive layer 380 can be formed from any suitable material such as a metal, by any suitable technology such as physical vapor deposition (PVD), sputter coating, evaporation, etc., where such technologies can be vacuum based, as necessary.

Figure 4:
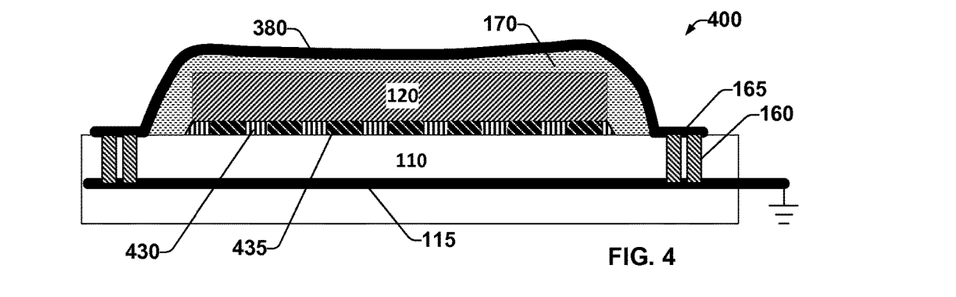
FIG. 4. illustrates a block diagram 400 of a structure for isolating a device from electromagnetic effects, according to an embodiment.

FIG. 4 illustrates system 400 comprising a configuration for isolating an RFIC component, according to an embodiment. System 400 comprises a base substrate layer 110 which includes a cage layer 115, which can be grounded, and one or more vias 160, where vias 160 can be connected to by an interconnect 165. Located on substrate 110 is an RFIC 120 which can be a flip chip and is located on substrate 110 by solder bumps 435 in conjunction with underfill material 430, or other suitable flip-chip locating technique. A flip chip configuration, as illustrated in FIG. 4 utilizing solder bumps 435 can negate the need for any wirebonds (e.g., wirebonds 140). A coating layer 170 can be formed over the RFIC 120, and any exposed underfill 430/solder bumps 435, where the volume of coating 170 is sufficient to coat the required components but can leave the interconnects 165 exposed. Subsequent to curing coating 170, a conductive layer 380 can be formed over the coating 170. The conductive layer 380 being formed to electrically connect to interconnects 165, to facilitate electromagnetic isolation of the RFIC 120, e.g., conductive layer 380, cage layer 115, vias 160, and interconnect 165, and thereby form a Faraday cage around the RFIC 120.

Figure 5:
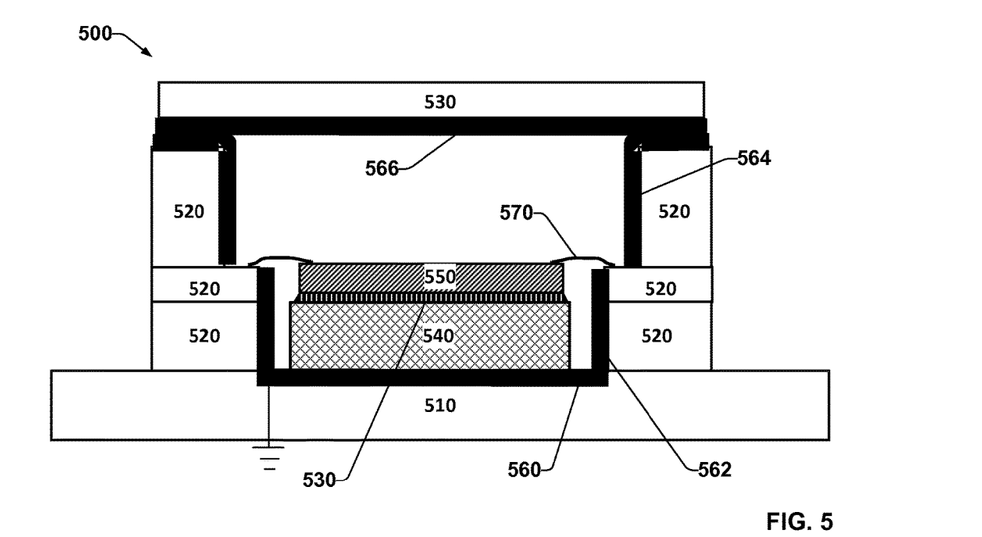
FIG. 5 illustrates a block diagram 500 of a structure for isolating a device from electromagnetic effects, according to an embodiment.

FIG. 5 illustrates system 500 comprising a configuration for isolating an RFIC component, according to an embodiment. System 500 comprises a base substrate layer 510 and further sidewalls 520. A cage layer 560 can be incorporated into substrate 510, with cage layer 560 being grounded as required. Located on substrate 510 is a heat sink 540 and a RFIC 550, with the RFIC 550 attached to heatsink 540 by any suitable underfill material 530, where underfill material 530 can be formed from epoxy resin, an adhesive, etc. A conductive layer 562 and 564 can be formed on a surface of walls 520 which in conjunction with a conductive coating 566 applied to a lid 530, can act as a Faraday cage around RFIC 550 and accordingly provide electromagnetic isolation of the RFIC 550. Wirebonds 570 can provide interconnection between the RFIC 550 and other components associated therewith.

Figure 6:
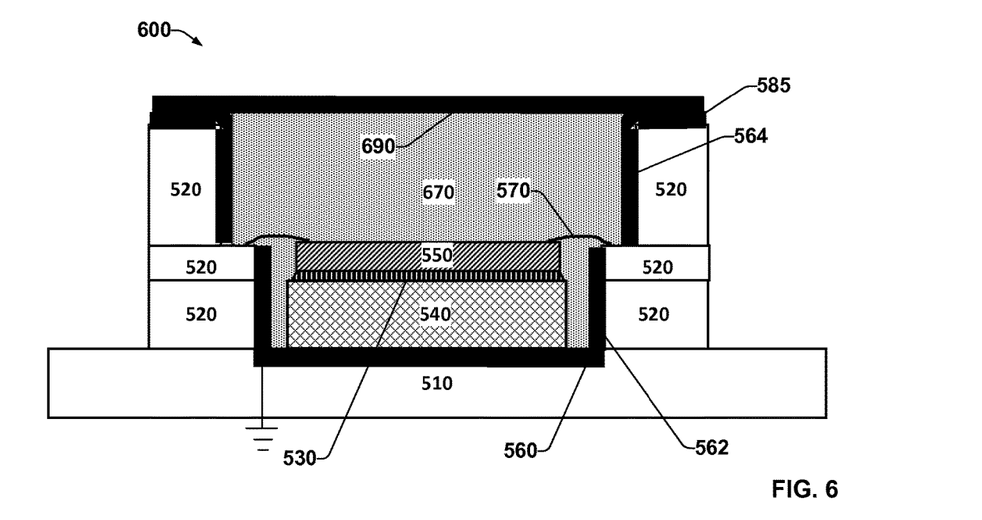
FIG. 6 illustrates a block diagram 600 of a structure for isolating a device from electromagnetic effects, according to an embodiment.

FIG. 6 illustrates system 600 comprising a configuration for isolating an RFIC component, according to an embodiment. System 600 comprises a base substrate layer 510 and further sidewalls 520. A cage layer 560 can be incorporated into substrate 510, with cage layer 560 being grounded as required. Located on substrate 510 is a heat sink 540 and a RFIC 550, with the RFIC 550 attached to heatsink 540 by any suitable underfill material 530. Conductive layers 580 and 585 can be formed on a surface of walls 520. Wirebonds 570 can provide interconnection between the RFIC 550 and other components associated therewith. A coating layer 670 can be formed to facilitate coverage of any of the heat sink 540, exposed portion(s) of the underfill material 560, the RFIC 550, wirebonds 570, exposed surfaces of sidewalls 520 and conductive layers 560, 562, and 564. Subsequent to curing coating 670, a conductive layer 690 can be formed over the coating 670. The conductive layer 690 being formed to electrically connect to the conductive layers 560, 562, and 564 to facilitate electromagnetic isolation of the RFIC 550, e.g., conductive layers 560, 562, 564 and 690 can form a Faraday cage around the RFIC 550. In an embodiment, coating 670 can be thermally conductive to facilitate conveyance of heat from the RFIC 550 while being electrically insulating.

Figure 8:
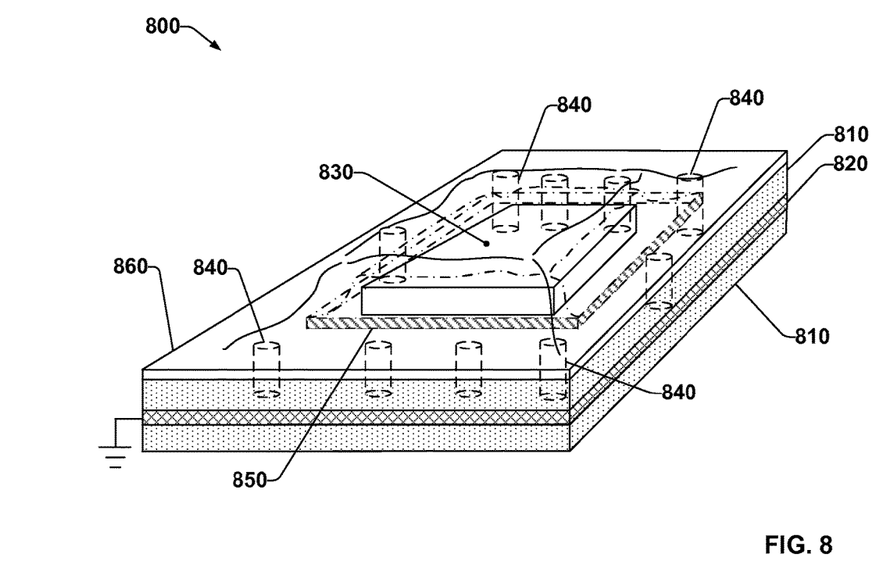
FIG. 8 illustrates a block diagram 100 of a structure for isolating a device from electromagnetic effects, according to an embodiment.

FIG. 8 illustrates a block diagram of a structure 800 which includes an RFIC and associated components to facilitate isolating of the RFIC component, according to an embodiment. System 800 comprises a base substrate layer 810 (e.g., similar to layers 110 and 510) which includes a cage layer 820 (e.g., similar to layers 115, 560, and 820), which can be grounded, and one or more vias 840 (e.g., similar to vias 160) connected to the cage layer 820. Located on substrate 810 is an RFIC 830 (e.g., similar to RFICs 120 and 550). For the sake of simplicity of illustration, while not shown, the RFIC 830 can be attached to the substrate 810 by die attachlayer, and further wire bonds can provide electrical connection between the RFIC 830 and other components associated therewith, as previously described. A coating layer 850 (e.g., similar to layers 170 and 670) can be formed over the RFIC 830. Subsequent to curing coating 850, a conductive layer 860 (e.g., similar to layers 180, 280, 380, and 690) can be formed over the coating 850. The conductive layer 860 being formed to electrically connect to interconnects 840, to facilitate electromagnetic isolation of the RFIC 830, e.g., conductive layer 860, cage layer 820, and vias 840 can form a Faraday cage around the RFIC 830.

It is to be appreciated that while FIGS. 1-6 and 8 depict a single RFIC 120, 550, or 830 located on a respective substrate 110, 510, or 810, the various embodiments presented herein are not so limited and a plurality of RFIC's can be located on substrate 110 (and similarly substrates 510 and 810) to be subsequently coated in a coating (e.g., coating 170, 670, or 850) and a conductive layer (e.g., any of conductive layer 180, 280, 380, or 690) formed thereover.

Figure 9:
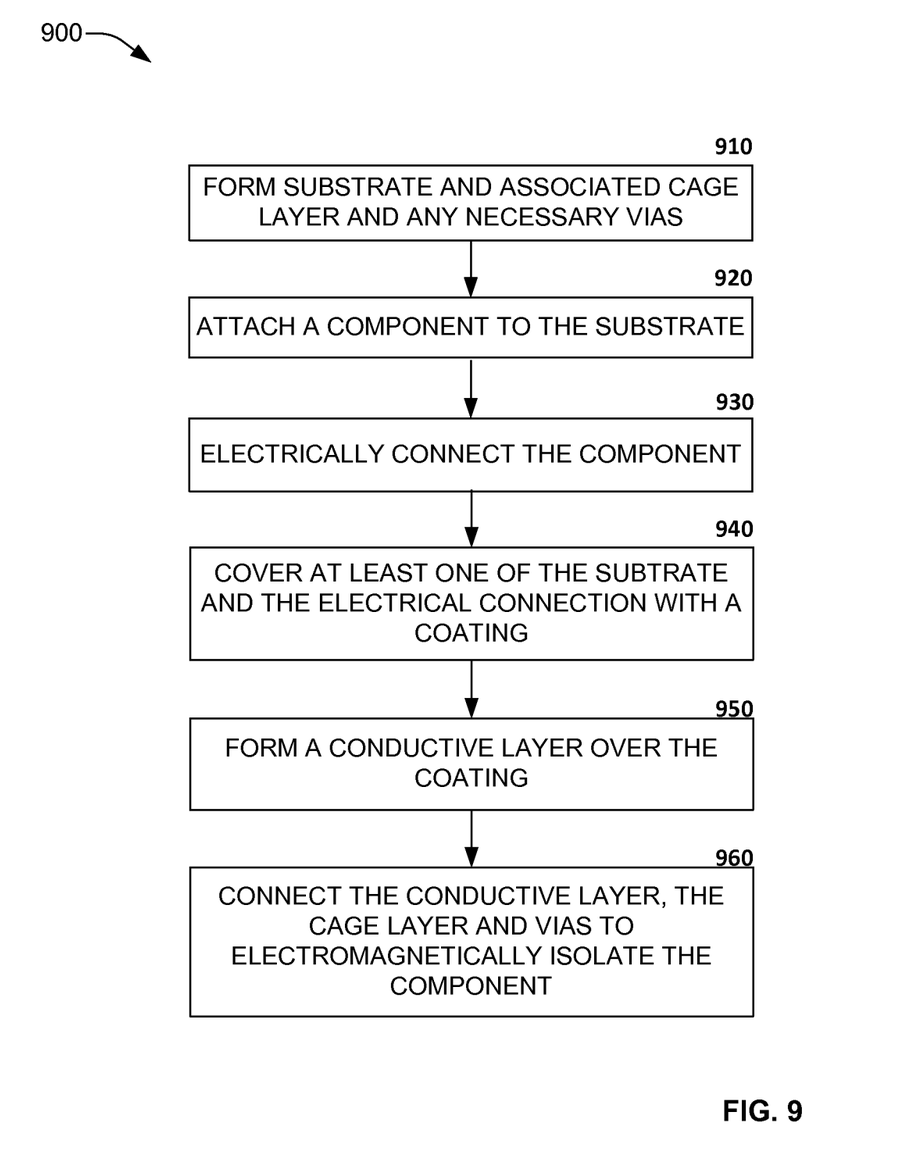
FIG. 9 is a flow diagram illustrating an exemplary methodology for isolating a device from electromagnetic effects.

FIG. 9 is an exemplary methodology relating to EMI of components. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodology can be stored in a computer-readable medium, displayed on a display device, and/or the like FIG. 9 illustrates an exemplary methodology 900 for EMI of components. At 910, a substrate can be formed in conjunction with a cage layer and any necessary vias/interconnects formed therein. The cage layer, in conjunction with a subsequently formed conductive layer, can be electrically connected (e.g., with the vias) to form an electromagnetically isolating structure such as a Faraday cage.

At 920, other components to be incorporated into a structure (e.g., an IC device) can be located on the substrate. In an embodiment, an RFIC can be located on the substrate by utilizing an adhesive, underfill material, etc. In a further embodiment, a heat sink component can be co-located with the RFIC, where the heat sink can be utilized to convey heat away from the RFIC during operation of the structure/device.

At 930, the RFIC and any other necessary components can be electrically coupled, for example, by wire bonds or, in the case of the RFIC being a flip-chip, solder bumps. The solder bump forming/coupling operation can be performed during connection of the flip-chip IC to the substrate.

At 940, at least one of the RFIC, the heat sink, the underfill material, the solder bumps, the wire bonds, etc., can be covered with a coating. The coating can be utilized to provide environmental protection to any of the underlying components. Further, the coating can be modified (e.g., from a conventional glob-top material such as an epoxy) to improve the dielectric constant of the coating (e.g., from the previously mentioned example of k=about 3.5 to a k=about 2.0). For example, the coating material can include solid material such as glass beads as well as hollow material such as glass spheres, as previously described.

At 950, upon curing of the coating (and any required planarization), a conductive layer can be applied thereon. The conductive coating can be a metallized layer applied by such processes as PVD, sputtering, etc., as well as a polymer layer which can have its conductive properties further improved by the addition of conductive particles such as a metallic powder.

At 960, the conductive layer can be electrically connected to the cage layer and vias, etc., to form a Faraday cage around the RFIC.

It is to be appreciated that while the formation of electromagnetic isolation structures, etc., are described, there may be certain procedures that are not fully disclosed during description of the various embodiments as presented herein. However, rather than provide description of each and every operation involved in the various operations facilitating formation, patterning, removal, etc., of each structure presented herein, for the sake of description only the general operations are described. Hence, while no mention may be presented regarding a particular operation pertaining to aspects of a particular figure, it is to be appreciated that any necessary operation, while either not fully disclosed, or not mentioned, to facilitate formation/deconstruction of a particular layer/element/aspect presented in a particular figure is considered to have been conducted. For example, while no mention may be made regarding a layer described in a preceding figure being leveled (e.g., by CMP, or other suitable operation) it is considered, for the sake of readability of the various exemplary embodiments presented herein, that the leveling process occurred, as have any other necessary operations. It is appreciated that the various operations, e.g., leveling, CMP, patterning, photolithography, deposition, implantation, layer formation, etching, bonding, etc., are well known procedures and are not necessarily expanded upon throughout this description.

The various embodiments presented herein relate to electromagnetic isolation of components to mitigate deleterious effects associated with operating computer circuitry under radio frequency conditions. Contrary to utilizing conventional techniques of placing shields in the form of lids, containers, etc., around a RFIC, the various embodiments presented herein relate to incorporating the shielding process into a device fabrication process, for example when incorporating one or more IC's into a semiconductor/computing device such as a circuit board for a cellphone application. During assembly of the circuit board the protective coating can be modified to have improved dielectric properties. Further, the protective coating can be covered with a conductive layer which can form part of an EMI structure, where the conductive layer can be a metallized layer or a conductive polymer. Such an approach can reduce manufacturing costs (e.g., reduction in number of material layers) compared with incorporating the circuit board and associated IC's inside of a Faraday container, and further reduce the overall size and complexity of the device. Furthermore, by utilizing a combination of coating (conductive or non-conductive) with the conductive layer can enable operation under conditions of up to about 150 dB. Also, the various embodiments utilizing thin film metallization can further enable fine features, improved solderability, etc., which can facilitate extension of the various embodiments to application with LTCC materials, for example.

What has been described above includes examples of one or more embodiments. It is, of course, not possible to describe every conceivable modification and alteration of the above structures or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An integrated circuit device comprising:
   a substrate, wherein the substrate comprises an electromagnetic cage layer that extends laterally through the substrate;
   a radio frequency integrated circuit (RFIC) located on the substrate;
   a coating layer having an upper surface and a lower surface, the coating layer primarily formed of a material that has a first dielectric constant, the coating layer deposited on the RFIC, the lower surface of the coating layer covering the RFIC, wherein the coating layer further comprises spherical glass beads that are solid throughout, wherein the coating layer with the spherical glass beads has a second dielectric constant that is lower than the first dielectric constant; and
   a conductive layer located on the upper surface of the coating layer, the conductive layer having an upper surface and a lower surface, wherein the lower surface of the conductive layer is in direct contact with the upper surface of the coating layer, the upper surface of the coating layer is encased by the lower surface of the conductive layer, and the conductive layer is formed to connect with the electromagnetic cage layer to form a Faraday cage around the RFIC.

2. The integrated circuit device of claim 1, wherein the conductive layer is formed by at least one of a physical vapor deposition, sputter coating, or evaporation.

3. The integrated circuit device of claim 1, wherein the coating layer comprises at least one of a conformal coating, a glob-top material, a resin, or an epoxy resin.

4. The integrated circuit device of claim 1, wherein the conductive layer comprises a polymer and conductive material.

5. The integrated circuit device of claim 1, wherein the RFIC is a flip chip.

6. The integrated circuit device of claim 1, further comprising a first sidewall and a second sidewall located on the substrate, wherein the first sidewall and the second sidewall configured to constrain the coating layer.

7. The integrated circuit device of claim 1, wherein the electromagnetic caging layer is a mesh.

8. The integrated circuit device of claim 1, further comprising at least one interconnect, wherein the coating layer is formed such that the at least one interconnect remains exposed, and the conductive layer is formed to electrically connect with the at least one interconnect.

9. The integrated circuit device of claim 1, wherein the integrated circuit device provides electromagnetic isolation of 150 dB to the RFIC.

10. An integrated circuit device comprising:
    a substrate having an electromagnetic caging layer extending laterally therethrough;
    a radio frequency integrated circuit (RFIC) located on the substrate;
    a coating layer that is primarily formed of a material that has a first dielectric constant, the coating layer has an upper surface and a lower surface, the coating layer deposited on the RFIC, the lower surface of the coating layer covering the RFIC and the coating layer comprising a conformal coating and spherical glass beads within the conformal coating, the spherical beads being solid throughout, wherein the coating layer has a second dielectric constant that is lower than the first dielectric constant due to inclusion of the spherical glass beads in the coating layer; and
    a conductive layer conformally applied to the upper surface of the coating layer, such that a lower surface of the conductive layer is in direct contact with the upper surface of the coating layer and the upper surface of the coating layer is encased by the lower surface of the conductive layer, wherein the conductive layer is formed to connect with the electromagnetic caging layer to form a Faraday cage around the RFIC, wherein the integrated circuit device provides electromagnetic isolation of 150 dB to the RFIC.

11. The integrated circuit device of claim 10, wherein the conductive layer is formed by at least one of a physical vapor deposition, sputter coating, or evaporation.

12. The integrated circuit device of claim 10, wherein the conductive layer comprises metallic material.

* * * * *